US008923386B2

United States Patent
Samardzija et al.

(10) Patent No.: US 8,923,386 B2
(45) Date of Patent: Dec. 30, 2014

(54) METHOD AND APPARATUS FOR SIGNAL COMPRESSION AND DECOMPRESSION

(75) Inventors: Dragan M. Samardzija, Highlands, NJ (US); John Pastalan, Hampton, NJ (US); William M. MacDonald, Bridgewater, NJ (US); Reinaldo A. Valenzuela, Holmdel, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/025,255

(22) Filed: Feb. 11, 2011

(65) Prior Publication Data
US 2012/0207206 A1 Aug. 16, 2012

(51) Int. Cl.
*H04B 1/66* (2006.01)
*H03M 7/30* (2006.01)
*H04L 27/32* (2006.01)

(52) U.S. Cl.
CPC . *H03M 7/30* (2013.01); *H04L 27/32* (2013.01)
USPC ............................................. 375/240

(58) Field of Classification Search
USPC .......................................... 375/240, 240.03
See application file for complete search history.

(56) References Cited

U.S. PATENT DOCUMENTS

| 6,480,528 | B1* | 11/2002 | Patel et al. ..................... 375/148 |
| 7,009,533 | B1 | 3/2006 | Wegener |
| 7,318,027 | B2 | 1/2008 | Lennon et al. |
| 7,522,074 | B2* | 4/2009 | Wegener ........................ 341/61 |
| 7,801,735 | B2* | 9/2010 | Thumpudi et al. ............ 704/503 |
| 2002/0191692 | A1* | 12/2002 | Fallon et al. .................. 375/240 |
| 2007/0116046 | A1 | 5/2007 | Liu et al. |
| 2007/0288977 | A1 | 12/2007 | Shalvi et al. |
| 2008/0198918 | A1* | 8/2008 | Van Der Vleuten .......... 375/240 |
| 2008/0232457 | A1* | 9/2008 | Fallon et al. .................. 375/240 |
| 2008/0291993 | A1* | 11/2008 | Li et al. ......................... 375/240 |
| 2009/0073006 | A1* | 3/2009 | Wegener ........................ 341/61 |
| 2009/0135966 | A1* | 5/2009 | Fischer et al. ................ 375/341 |
| 2009/0154545 | A1* | 6/2009 | Fallon et al. .................. 375/240 |
| 2009/0201182 | A1* | 8/2009 | Wegener ........................ 341/76 |
| 2011/0099295 | A1* | 4/2011 | Wegener ........................ 709/247 |
| 2012/0014422 | A1* | 1/2012 | Wegener ........................ 375/222 |

FOREIGN PATENT DOCUMENTS

| JP | H04-255191 A | 9/1992 |
| JP | 2006-518873 A | 8/2006 |
| KR | 2007-0008211 A | 1/2007 |
| WO | WO-2009/151893 A2 | 12/2009 |
| WO | WO 2010/104438 | 9/2010 |

OTHER PUBLICATIONS

Hazanchuk et al.,"Optimizing Up/Down Conversion with FPGA Techniques", EE Times, published Dec. 23, 2003—Internet Citation—Retrieved on Dec. 13, 2013, URL: http://www.commsdesign.com/showArticle.jhtml?articleID=17100057.*

(Continued)

*Primary Examiner* — Daniel Washburn
*Assistant Examiner* — Berhanu Tadese
(74) *Attorney, Agent, or Firm* — Harness, Dickey & Pierce (57) ABSTRACT

In one embodiment, the method of compressing a digital signal includes reducing redundancies in the digital signal, scaling a block of samples output from the reducing step by a scaling factor, and quantizing the scaled samples to produce compressed samples. The digital signal being compressed may be a digital radio frequency signal.

11 Claims, 7 Drawing Sheets

(56) References Cited

OTHER PUBLICATIONS

"Common Public Radio Interface (CPRI); Interface Specification", CPRI Specification V4.2 (Sep. 29, 2010).*

Helen Tarn et al., 3GPP LTE Digital Front End Reference Design—XAPP1123, Oct. 29, 2008, XP55027192, retrieved from the internet: URL:http://read/pudn.com/downloads160/doc/718492/LTE_DFE_AppNote.pdf, retrieved on May 15, 2012, pp. 6-7, 11-14, 19-21, 48-49 and 69.

"LM97593—Dual ADC/Digital Tuner/AGC," Mar. 12, 2008, XP 55027195, retrieved from the internet: URL:http://www.ti.com/lit/ds/snws019a/snws019a.pdf, retrieved on May 15, 2012, pp. 1, 27, 30 and 35.

International Search Report and Written Opinion dated May 25, 2012.

Notice of Reason for Refusal dated Sep. 2, 2014 for Japanese Patent Application No. 2013-553475.

* cited by examiner

METHOD AND APPARATUS FOR SIGNAL COMPRESSION AND DECOMPRESSION

BACKGROUND OF THE INVENTION

In a number of wireless base-station solutions baseband units (BBUs) and radio subsystems are separate and physically remote. In those solutions the antennas, radio-frequency front-end and analog-to-digital interface are a part of remote-radio heads (RRHs). The RRHs are connected to the BBUs via a digital transport network. Digitized baseband complex inphase (I) and quadrature (Q) samples are transported over the transport links between the RRHs and BBUs. In many wireless technologies (3G and 4G), transmission of I/Q samples requires high data rates and allocation of significant transport network resources in terms of communication bandwidth as well as good performance such as low latency and jitter. Thus, a reduction in the resources required to transport I/Q samples will result in a commensurate reduction in the cost of the transport.

SUMMARY OF THE INVENTION

Example embodiments provide a compression scheme that lowers the required transport data rates. For example, in Long Term Evolution (LTE), an embodiment results in approximately 3.5 times lower data rates than in the case of uncompressed I/Q transmission.

The example embodiments are general in nature and hence, may be applied to different wireless technologies, (e.g., LTE/LTE-Advanced and UMTS/HSPA), as well as, on the uplink and downlink. These example embodiments may be effective in any solution where a digital representation of an analog signal is to be transported. For example, one or more example embodiment could be the basis for a digital neutral host distributed antenna system (DAS).

Furthermore, the example embodiments maintain the overall signal quality, i.e., error-vector magnitude (EVM) and adjacent channel power ratio (ACPR) that are required by a particular wireless technology, i.e., standard. In addition, the example embodiments are parameterized such that a smooth trade-off between the required signal quality and compression performance can be achieved through operator choice of the suitable parameter values.

In addition, the example embodiment introduce limited processing delay (i.e., compression and decompression latency), compared to the uncompressed version.

The example embodiments may be applied in conjunction with any transport technology (Gigabit Ethernet (GigE), Gigabit Passive Optical Network (GPON), Ethernet Passive Optical Network (EPON), Data Over Cable Service Interface Specification (DOCSIS), etc.).

As the industry standard, the common public radio interface (CPRI) transport technology has been widely applied to connect RRHs and BBUs. It supports different network architectures, and is based on TDMA. It transports uncompressed I/Q samples resulting in much higher data rate requirements than the compression schemes in the example embodiments.

In the example embodiments, the RRH design does not implement any BBU functionality, i.e., it does not perform physical layer processing that is specific to any particular wireless technology. Furthermore, in the example embodiments no control signaling is exchanged between the RRHs and BBUs. This is beneficial because it limits the RRH role to a generic interfacing. This thus makes the example embodiments both technology and implementation agnostic.

In one embodiment, the method of compressing a digital signal includes reducing redundancies in the digital signal, scaling a block of samples output from the reducing step by a scaling factor, and quantizing the scaled samples to produce compressed samples. The digital signal being compressed may be a digital radio frequency signal.

As an example, the reducing step may include filtering the digital signal, and decimating output from the filtering step.

The block size and/or scaling factor of the scaling step may be fixed or adaptively determined.

The resolution of the quantization step may also be fixed or adaptively determined.

A further embodiment includes determining a compression error, compressing the compression error, and sending the compressed compression error over a separate link from a link carrying the compressed samples.

In one embodiment, the method of decompressing a compressed digital signal includes dequantizing received samples, descaling a block of the dequantized samples, and inserting redundancies into the descaled samples to produce a digital signal having a desired spectrum.

Another embodiment is directed to a network element. The network element may include circuitry generating a first digital signal, a compressor and decompressor. The compressor is configured to reduce redundancies in the first digital signal to produce inter mediate compressed samples, scale a block of the intermediate compressed samples by a scaling factor, quantize the scaled samples to produce compressed samples, and send the compressed samples over a transport link as a first compressed signal. The decompressor is configured to receive a second compressed signal over the transport link, dequantize samples in the second compressed signal, descale a block of the dequantized samples, and inserting redundancies into the descaled samples to produce a second digital signal having a desired spectrum.

BRIEF DESCRIPTION OF THE DRAWINGS

The example embodiments will become more fully understood from the detailed description given herein below and the accompanying drawings, wherein like elements are represented by like reference numerals, which are given by way of illustration only and thus are not limiting of the example embodiments and wherein.

DETAILED DESCRIPTION OF THE EMBODIMENTS

Detailed illustrative embodiments are disclosed herein. However, specific structural and functional details disclosed herein are merely representative for purposes of describing example embodiments. An embodiment may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are discussed herein as being implemented in a suitable computing environment. Although not required, exemplary embodiments will be described in the general context of computer-executable instructions, such as sections, program modules or functional processes, being executed by one or more computer processors or CPUs. Generally, sections, program modules or functional processes include routines, programs, objects, components, data structures, etc. that performs particular tasks or implement particular abstract data types. The sections, program modules and functional processes discussed herein may be implemented using existing hardware in existing communication networks. For example, sections, program modules and functional processes discussed herein may be implemented using existing hardware at existing network elements, servers or control nodes. Such existing hardware may include one or more digital signal processors (DSPs), application-specific-integrated-circuits, field programmable gate arrays (FPGAs) computers or the like.

In the following description, illustrative embodiments will be described with reference to acts and symbolic representations of operations (e.g., in the fat in of flowcharts) that are performed by one or more processors, unless indicated otherwise. As such, it will be understood that such acts and operations, which are at times referred to as being computer-executed, include the manipulation by the processor of electrical signals representing data in a structured form. This manipulation transforms the data or maintains it at locations in the memory system of the computer, which reconfigures or otherwise alters the operation of the computer in a manner well understood by those skilled in the art.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
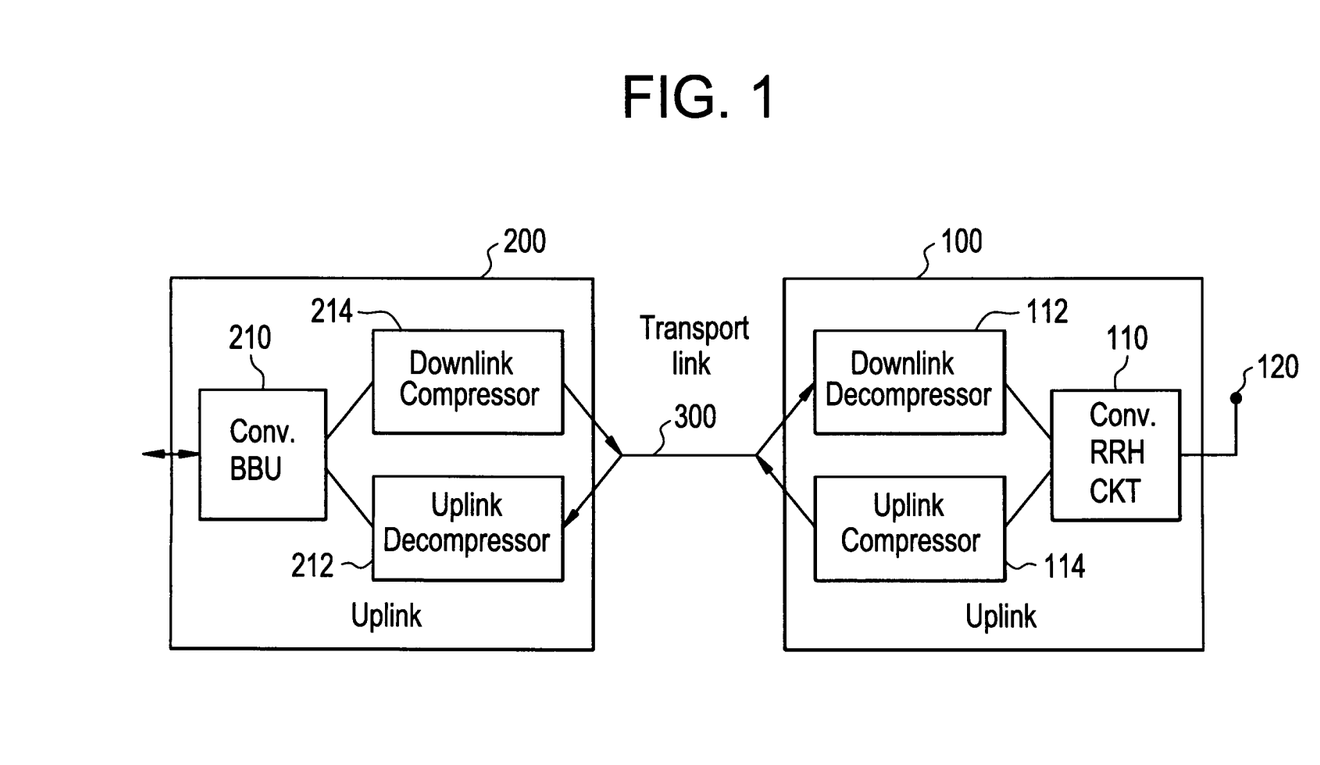
FIG. 1 illustrates a system according to an example embodiment.

FIG. 1 illustrates a system according to an example embodiment. As shown, the system includes an RRH 100 and BBU 200 connected via a transmission medium such as a transport link 300. The transport link 300 may be wired or wireless. For example, the transport link 300 may be any transport technology such as Gigabit Ethernet (GigE), Gigabit Passive Optical Network (GPON), Ethernet Passive Optical Network (EPON), Data Over Cable Service Interface Specification (DOCSIS), etc.

The RRH 100 includes conventional RRH circuitry 110. On the uplink, an I/Q compressor 114 is connected between the conventional RRH circuitry 110 and the transport link 300. As is known, the conventional RRH circuitry 110 includes radio-frequency front-end and analog-to-digital converter (ADC) that converts a received analog radio signal on antenna 120 into the digital I/Q sample form. Typically, the ADC is a conventional high-resolution converter. After the analog-to-digital conversion, the uplink compressor 114 applies I/Q compression, and the compressed digital I/Q signal is transported to the BBU 200 via the transport link 300.

The BBU 200 includes conventional BBU circuitry 210. On the uplink, an uplink decompressor 212 applies decompression, which followed by the receiver base-band processing (i.e., physical layer) of a particular wireless technology at the conventional BBU circuitry 210.

Conversely, on the downlink, the transmitter of the conventional BBU circuitry 210 generates a sequence of I/Q samples, which are compressed by a downlink compressor 214. The output of the downlink compressor 214 is then transported to the RRH 100 via the transport link 300. A downlink decompressor 112 decompresses the I/Q samples. Following the decompression, the RRH digital-to-analog converter (DAC) and radio-frequency front-end of the conventional RRH circuitry 110 convert the sequence of decompressed I/Q samples into the analog radio signal, which is transmitted via antenna 120. Typically the DAC is a conventional high-resolution converter.

As discussed above, the RRH radio-frequency front-end, ADC, DAC as well as BBU processing may be identical to the ones ordinarily applied for a given wireless technology. Namely, there is nothing in those subsystems that is specifically implemented to accommodate the I/Q compression and decompression, which will be discussed in detail below.

Uplink and downlink compression operates in the same manner. Similarly, uplink and downlink decompression operates in the same manner. Accordingly, a single instance of compression and a single instance of decompression will be described for the sake of brevity.

Compression

Figure 2:
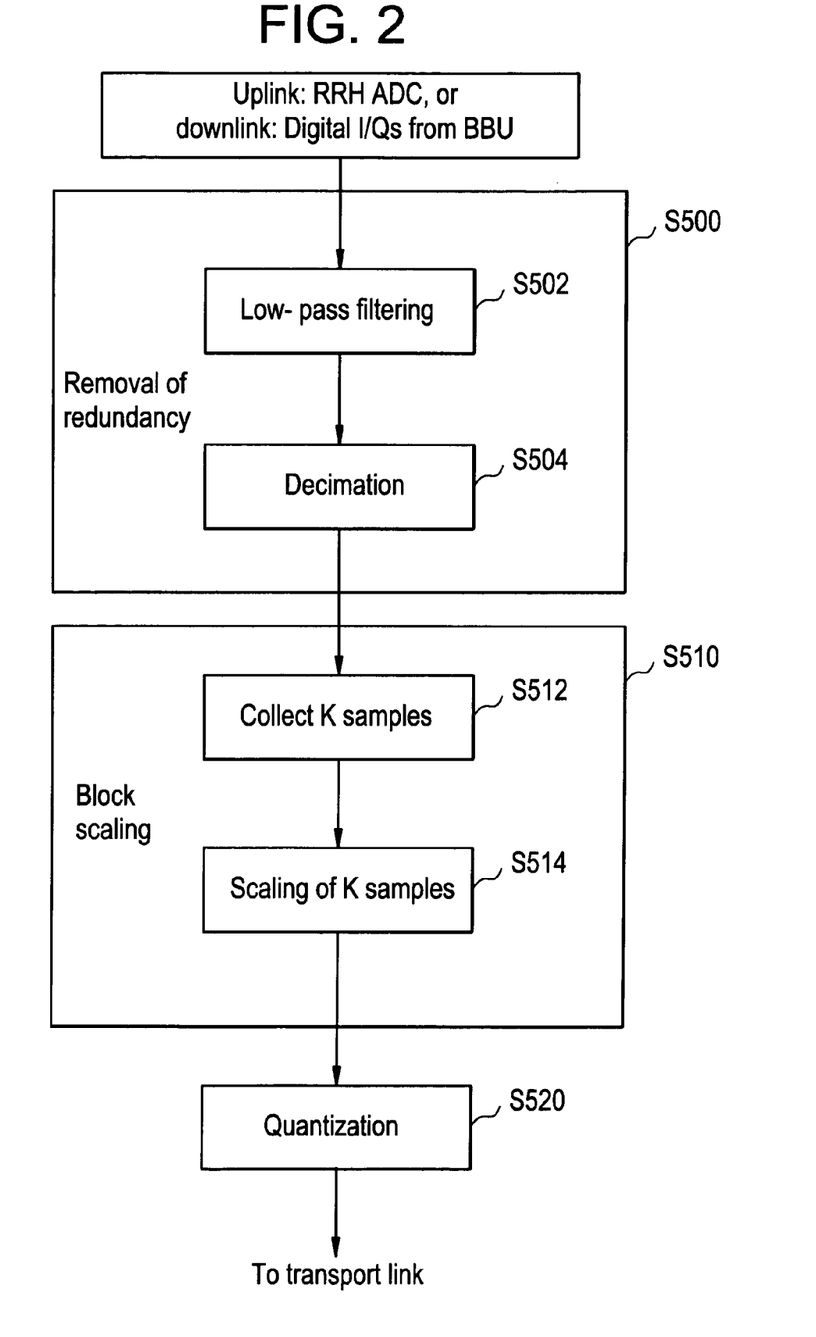
FIG. 2 illustrates a flow chart of an embodiment of compression.

FIG. 2 illustrates a flow chart of an embodiment of compression. As shown, compression involves three main processes: removal of redundancies in the spectral domain S500, block scaling S510 and quantization S520. Each process will be described in detail below.

Removal of Redundancies in the Spectral Domain—S500

Conventionally, the sampling rate of the ADC, DAC and BBU processing is higher than the minimum required according to the Nyquist sampling theorem. For example, in 10 MHz LTE, the sampling rate is 15.36 MHz (both for the BBU processing and in the case of CPRI uncompressed transmission). In addition, for UMTS/HSPA as well as cdma2000/EV-DO, 2-time and 4-time oversampling is customary. This results in redundancies in the spectral or frequency domain.

Namely, in the uncompressed form, a spectrally broader signal is transmitted than what may be necessary.

Consequently, process S500 removes these redundancies. As shown in FIG. 2, the removal process includes low-pass filtering S502 the digital base band signal followed by decimation S504. In one embodiment, these processes are performed in a streaming fashion, sample-by-sample. For example, in one embodiment, the filtering S502 is performed by a finite-impulse response (FIR) filter, and decimation S504 is performed by up- and down-sampling. The filtering S502 and decimation S504 will depend on the base band signal, and particularly, the frequency band and amount of oversampling.

Conceptually, nothing is exclusive to a particular wireless technology. Particular parameters (e.g., bandwidth and sampling rate) should be specified for a given wireless technology. Furthermore, the low-pass filter parameters may be selected empirically or by design choice to balance and/or optimize complexity-versus-performance tradeoff.

Block Scaling—S510

Block scaling may also be called block floating-point. Here, a block of K I/Q samples output from the decimation operation S504 are collected in step S512. The block of K I/Q samples are then divided by a scaling factor in step S514.

The scaling factor may be a fixed number of bits, the value of which may vary block-by-block. The scaling factor may be determined as discussed in detail below with respect to equation (3). Also as discussed in detail below, the amount of scaling affects quantization. Accordingly, for a given communication environment and/or standard, a scaling factor that reduces and/or minimizes the subsequent quantization error may be empirically determined.

Also, the block length K is a design parameter and may be derived from a trade-off analysis between desired signal quality (e.g., EVM and ACPR) and transport data rates. In one embodiment, the block length K may be fixed. However, as will be discussed in greater detail below. The block length is not limited to being fixed. Instead, the block length may be dynamically and/or adaptively determined.

Because the scaling factor, and possibly the block length, may change, one or more of these parameters may be transmitted adding to overhead. For example, the scaling factor may be transmitted once every K I/Q samples. Lowering the block length K will lower the subsequent quantization error, while increasing the transmission overhead. Therefore, the block length K is a design parameter derived from the trade-off analysis between the required signal quality (e.g., EVM and ACPR) and transport data rates.

Quantization—S520

After the block scaling S510, I/Q samples are quantized using a quantizer with $N_b$-bit resolution per each complex component. In one embodiment, the number of bits representing a sample may be truncated to the $N_b$ most significant bits. This operation is performed sample-by-sample.

Alternatively, a simple linear (i.e., uniform) quantizer may be applied. However, application of a quantizer with the optimized distances between the quantization levels will result in lower quantization error, and improved signal quality. One example of a non-linear (i.e., non-uniform) quantizer is presented with respect to pseudo code (A) below. In that case, the quantization levels are optimized in conjunction with the above block scaling.

Higher resolution will improve the signal quality (i.e., lower quantization noise), while increasing the transport data rates. Therefore, the resolution $N_b$ is a design parameter derived from the trade-off analysis between the required signal quality and data rates.

Note that different parameters may be used to achieve desired performance on the uplink and downlink. For example, higher quantizer resolution and shorter block length are expected in the uplink case because the uplink signal is expected to have a larger dynamic range, as well as additive noise and interference present.

Decompression

Figure 3:
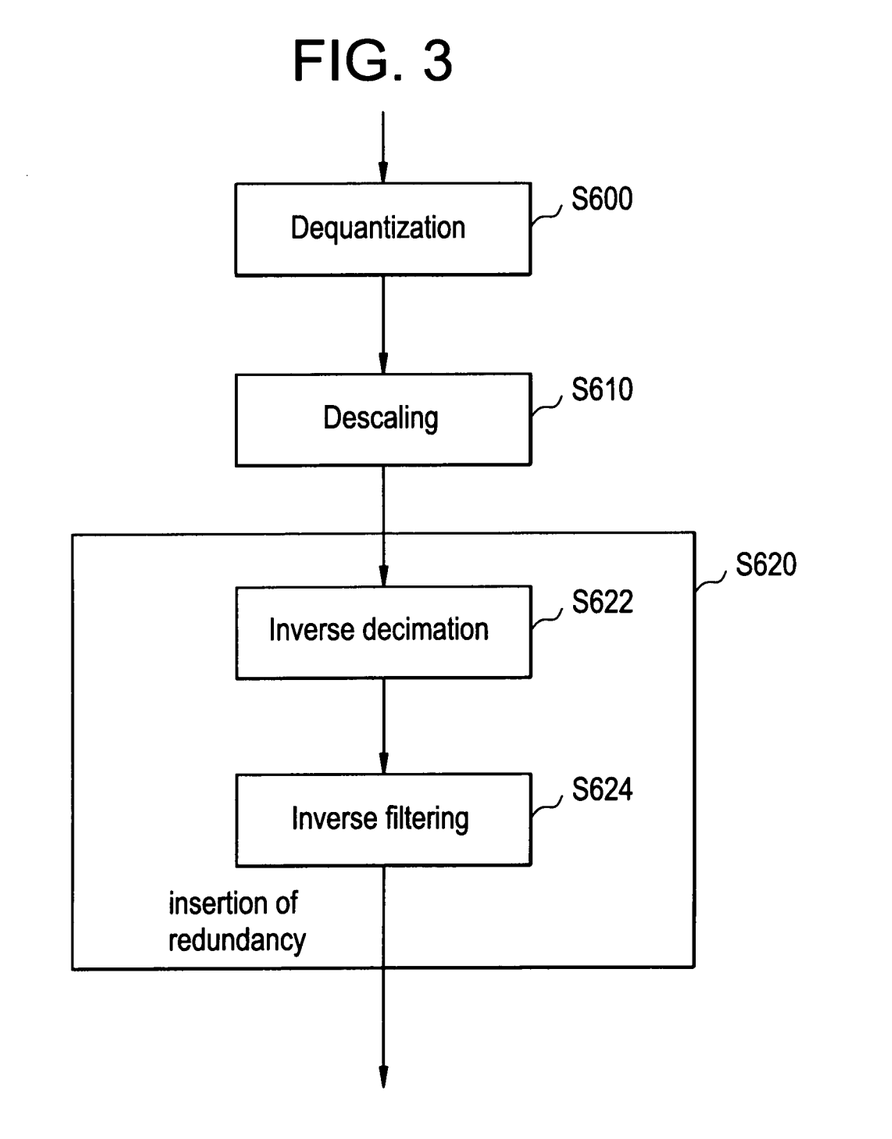
FIG. 3 illustrates a flow chart of an embodiment of decompression.

FIG. 3 illustrates a flow chart of an embodiment of decompression. As shown, decompression involves three main processes: dequantization S600, descaling S610, and insertion of redundancies S620, i.e., up-sampling. Each process will be described in detail below.

During dequantization S600, the inverse of the quantization operation is performed. Namely, the number of bits used to represent a sample is increased to the same resolution prior to quantization in step S520. In one embodiment, this may be performed by adding zeros as least significant bits. Alternatively, the inverse of the quantization process conducted in step S520 may be performed. For example, the inverse of the pseudo code (A) shown below may be performed if quantization in Step S520 proceeds as set forth in pseudo code (A).

During descaling S610, a block of K samples from the dequantization S600 are collected and multiplied by the scaling factor.

During insertion of redundancies S620, each sample from the descaling S610 undergoes inverse decimation S622, which is the inverse of the decimation in step S504. Similarly, the resulting samples are inverse filtered in S624, where the "filtering" is the inverse of the filtering performed in step S502. This is an up-sampling procedure.

In the following, two additional embodiments extending the above functionality will be described.

Adaptive Signal Quality Control

Optionally, an adaptive version of the above basic technique may be implemented where the parameters such as the block size K and resolution $N_b$ may be dynamically adapted over time based on some criterion, instead of being fixed. One such criterion that may be used for the adaptation is mean squared error (MSE), which is a good metric since it is a direct function of signal fidelity.

Figure 4:
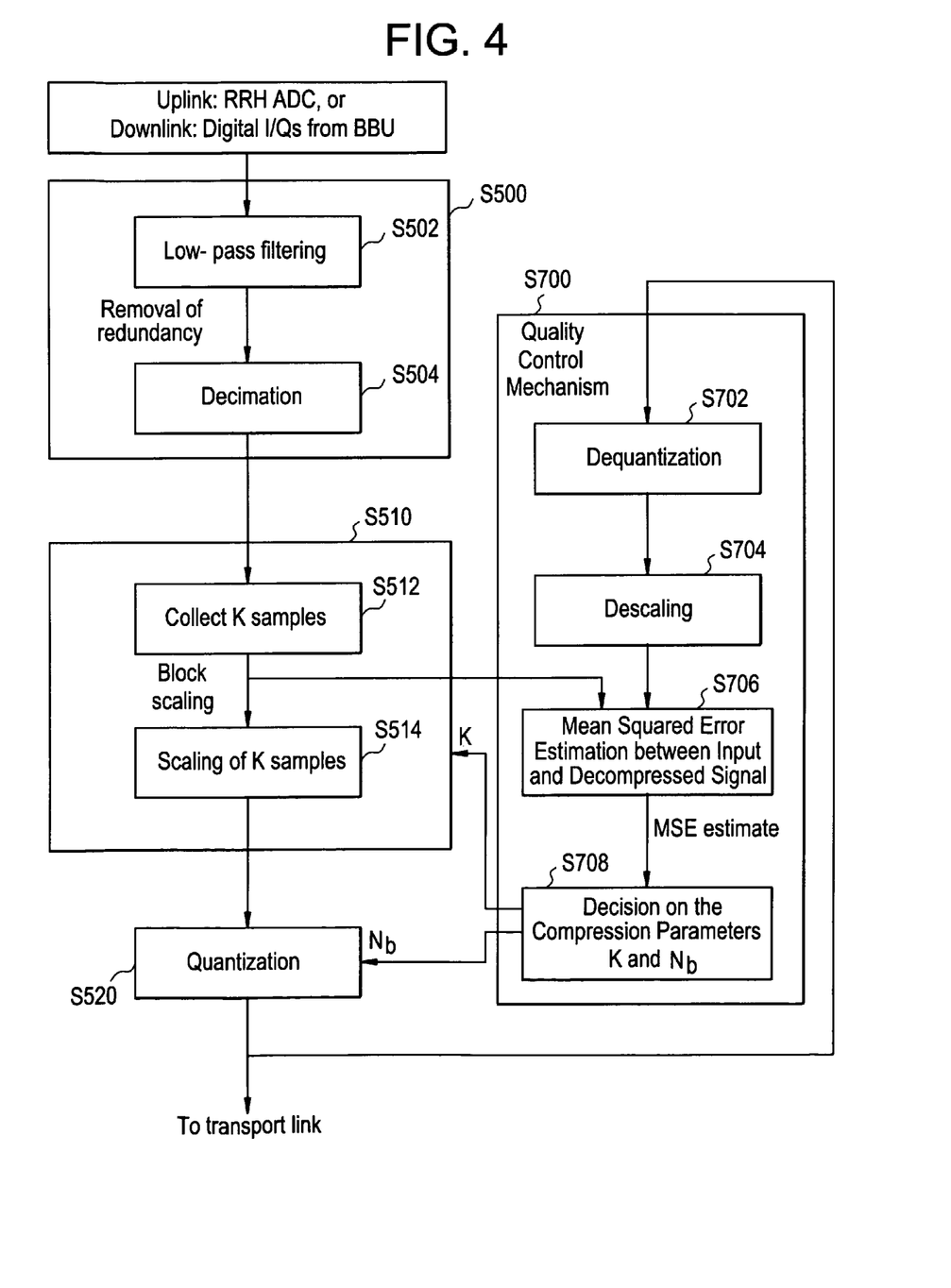
FIG. 4 illustrates a flow chart of another embodiment of compression.

FIG. 4 illustrates a flow chart of an embodiment of compression using adaptive signal quality mechanisms. As shown, the method of FIG. 4 is the same as the method of FIG. 2, except that the block size K in step S512 is supplied by a quality control mechanism or process S700 and the resolution $N_b$ in step S520 is supplied by the quality control process. Accordingly, for the sake of brevity, only the quality control process S700 will be described.

As shown, in step S702 the output of the quantization process S520 is dequantized in step S702 and then descaled in step S704 to produce a reconstructed block corresponding to the original block generated in step S512. This original block is stored (not shown), and in step S706, on a block by block basis, the MSE between the block of original samples and the block of reconstructed samples is determined or estimated. The MSE estimate is compared to a first threshold value $T_1$. If the MSE estimate is above this threshold, this indicates signal quality is less than desired. Accordingly, compression parameters such as the block size K and/or resolution $N_b$ are adapted in step S708. To improve the signal quality, the resolution $N_b$ may be increased by a resolution increment and/or the block size K may be decreased by a size decrement. Consequently the transport data rate will be increased.

Returning to step S706, if the MSE estimate is not greater than the first threshold $T_1$, the MSE estimate is compared to a second threshold $T_2$. If the MSE estimate is below the second threshold $T_2$, this indicates that the signal quality exceeds the desired signal quality requirements. Accordingly, the resolution $N_b$ may be lowered by a resolution decrement and/or the block size K increased by a size increment. Consequently, the transport data rate will be lowered. As will be appreciated, the second threshold $T_2$ may be lower than the first threshold $T_1$ to provide for a hysteresis effect.

The values of the thresholds, and the increments and decrements to $N_b$ and K are empirically determined using off-line analysis, and may be technology as well as uplink and downlink dependent.

If this adaptive mechanism is applied, additional information is sent between the RRH and BBU indicating the selection of the compression parameters (e.g., size K and resolution $N_b$). For example, these values may be inserted for each block prior to the block data in the uplink or downlink compression stream.

As will be appreciated, the decompression operation is the same as described with respect to FIG. 3 except the block size K and the resolution $N_b$ used in steps S610 and S600, respectively, are the values received before each block in the compression stream.

Compressed Transmission Over Multiple Links

In certain transport networks there may be multiple logical transport links between each RRH and BBU. Those links may be assigned different Quality-of-Service (QoS) attributes. For example, modern packet-based networks have QoS mechanisms such that each packet may be assigned a guaranteed maximum latency and maximum data rate according to a QoS class with which the packet is associated. The following embodiment exploits the above network architecture to improve I/Q transport.

Assume that there are L possible logical links or channels over the transport link 300, each associated with a unique QoS class. Link 1 has the lowest guaranteed latency, Link 2 the second lowest guaranteed latency and so on. The I/Q compression for Link 1 is performed as described in one of the above embodiments. Also, the compression error for Link 1 is compressed and sent over Link 2. In general, the compression error for Link i, is compressed and sent over Link i+1.

Figure 5:
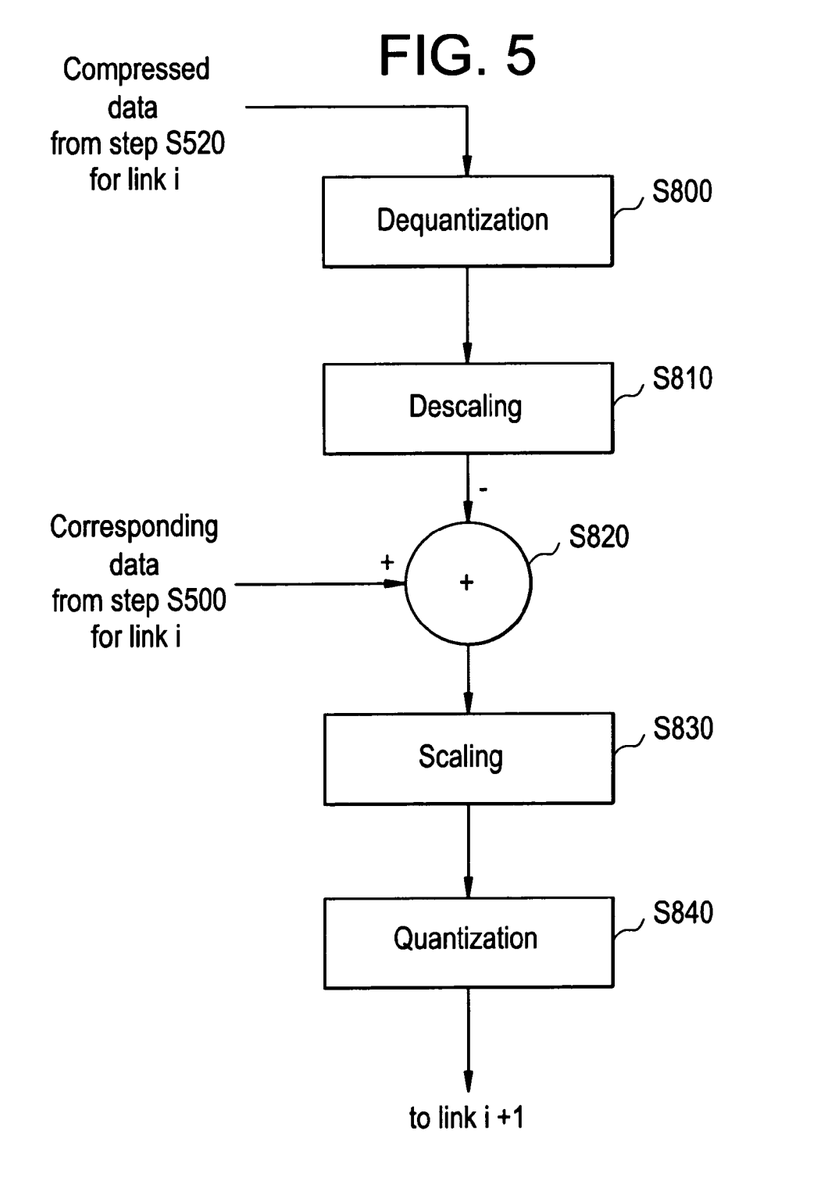
FIG. 5 illustrates an embodiment of the process for determining and compressing the compression error.

FIG. 5 illustrates an embodiment of the process for determining and compressing the compression error. As shown, in steps S800 and S810, the compressor may dequantize and descale the compressed data from step S520 in the same manner as described above with respect to steps S600 and S610. In step S820, the compressor determines the compression error as the difference between (1) the original data prior to scaling and quantization (e.g., the original data output from step S500) and (2) the corresponding data output from step S810. The compression error may undergo block scaling and quantization as described above with respect to steps S510 and S520 in steps S830 and S840. For each link, the quantization resolution $N_b$ is selected such that the transmission data rate matches the assigned QoS data rate of that particular link.

On the receiver side, for each link the decompression is performed individually on each link according to one of the above described embodiments. Assuming successful reception for each link, the decompression results $d_1, \ldots, d_L$ are summed up as shown by equation (1) below:

$$d = \sum_i^L d_i \qquad (1)$$

representing a composite output of the multi-link compressed I/Q transmission. Note that each link incrementally contributes to improving the quality of the composite decompressed signal. In general, for certain links, the transmission may exceed the required latency. The links with lower QoS attributes (i.e., longer guaranteed maximum latency) will have a higher probability of exceeding the required latency. In the case that Link m has not been received correctly, e.g., the required latency is exceeded, the summing is performed for the first m−1 links as shown by equation (2) below:

$$d = \sum_i^{m-1} d_i. \qquad (2)$$

In this case, the first m−1 links contribute to the decompressed signal.

The above solution exploits multiple links, taking into account their individual QoS attributes, to improve the overall signal quality.

Example Implementation

As one embodiment we present implementation of the above solution to compress and transport a 10 MHz LTE signal.

Figure 6:
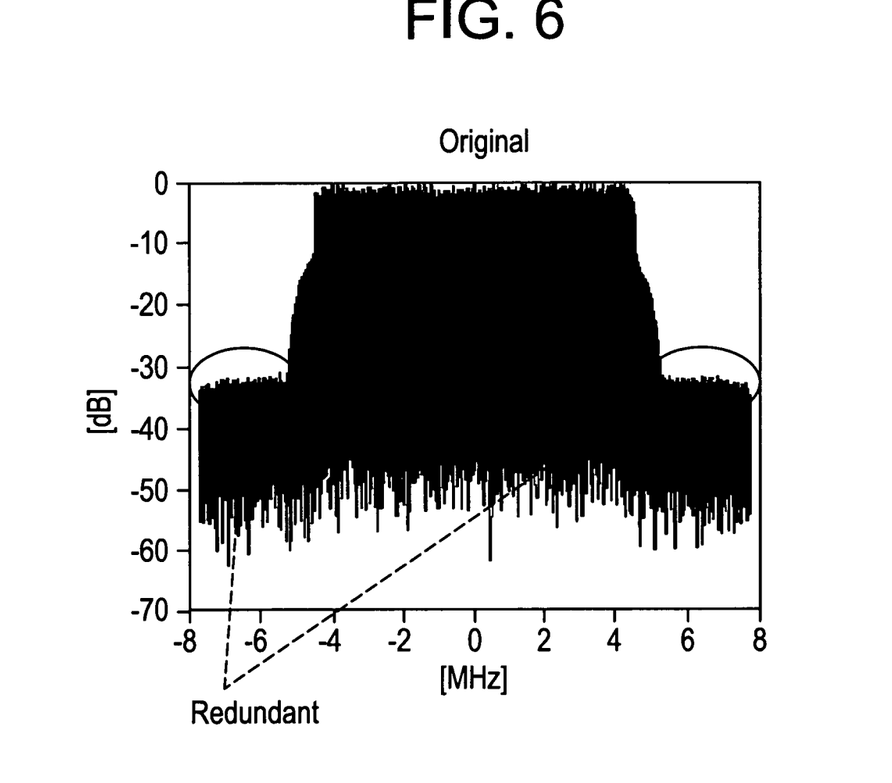
FIG. 6 illustrates an example of the 10 MHz LIE spectrum using a sample rate of 15.36 MHz.

In FIG. 6, an example of the 10 MHz LTE spectrum is presented using a sample rate of 15.36 MHz. Approximately one-third of the spectrum carries no information relevant to the LTE transmission. Therefore we have applied multi-rate filtering to lower the sample rate from 15.36 MHz down to 10.32 MHz. The filtering is implemented as a low-pass FIR filter, with the sin c(t) impulse response which is shaped using the Hamming window. In this example, the latency incurred by the filtering is 2.08 usec.

Note that there is nothing particular to the output sample rate which is in this example set to 10.32 MHz. Other sampling frequencies may be also considered to make the implementation easier. For example, 10.24 MHz is a ⅔ of the initial 15.36 MHz sampling rate, which may be more suitable for a possible ASIC/FPGA implementation.

Block scaling (step S510) is performed on a 24-sample block, with 16 bits used to represent the scaling factor. In this embodiment, in each block of K=24 samples, a sample with the largest absolute value is determined. That particular value is quantized with 16-bit resolution, and denoted as $A_m$. The corresponding scaling factor may be determined as shown by equation (3) below:

$$S = 2^{Nb-1}/A_m. \qquad (3)$$

Each sample in the block is then multiplied by the above scaling factor. This equation may also be used to determine the scaling factor in any of the above-described embodiments.

Due to the block size K=24, the latency incurred by the block scaling is 2.32 usec. Different block sizes may be selected for a particular implementation platform and wireless technology.

Figure 7:
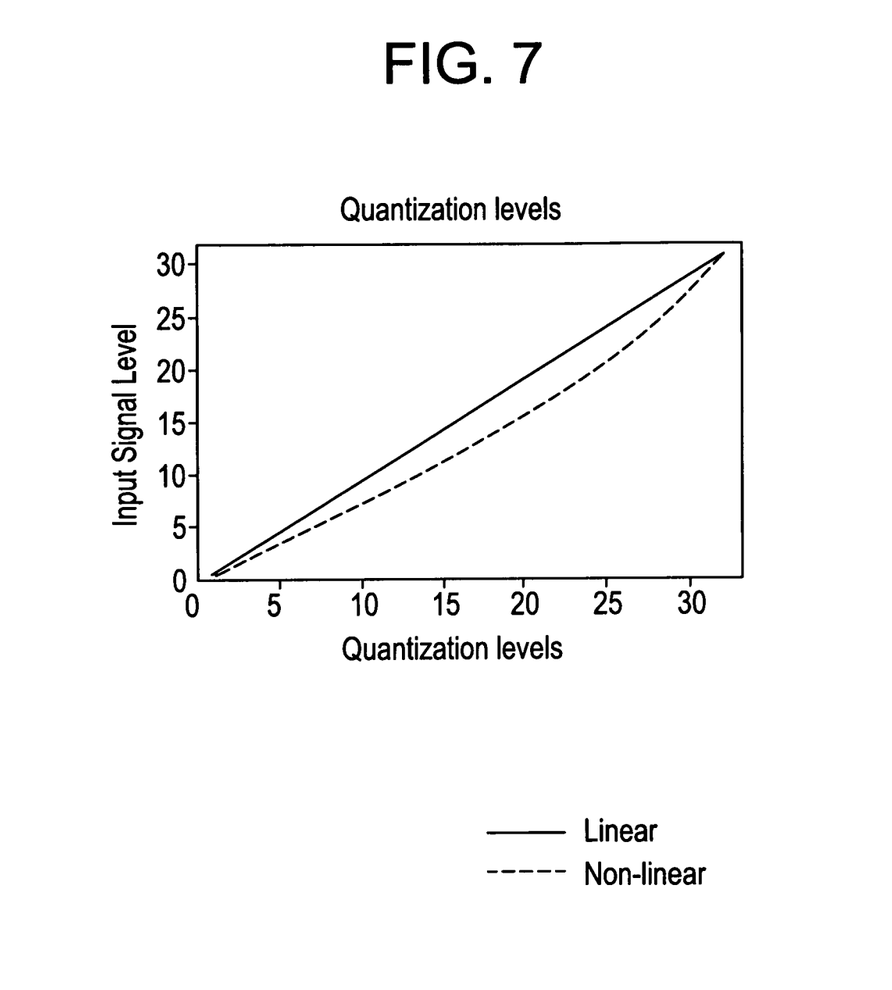
FIG. 7 illustrates linear and non-linear quantization levels with respect to input signal level.

In this embodiment, both linear as well as non-linear quantization were tested. For the 6-bit resolution, the quantization levels with respect to input signal level are depicted in FIG. 7. The non-linear quantization levels are determined using off-line analysis, where Gaussian signal distribution is considered. The following off-line adaptive procedure was used as shown by pseudo code (A) below.

```
for(k=1:N_sample)
  [n_dif n_q] = min(abs(quan_lev-abs(Y(k))));
  quan_lev(n_q) = quan_lev(n_q) – mu*(quan_lev(n_q)-abs(Y(k)));
end
```

Y is an array of iid samples with the Gaussian distribution which has been block-scaled. The 24-sample block size is used. The quart_lev may be an array of positive quantization levels determined by empirical study. The adaptation parameter mu is set to 0.05. Other optimization procedures could be used instead.

As a part of the decompression, block re-scaling was followed by interpolation and up-sampling, bringing the signal back to the original 15.36 MHz sampling rate and amplitude range. In this example, the overall compression and decompression latency is 6.5 usec. Possible application of statistical entropy-based compression schemes (e.g., Lempel-Ziv) were also considered. It was shown that after the proposed I/Q compression is applied, additional lowering of data rates due to a statistical compression is very low (typically a percent or two in the idealized case).

CONCLUSION

Example embodiments provide a compression scheme that lowers the required transport data rates. For example, in long term evolution (LTE), an embodiment results in approximately 3.5 times lower data rates than in the case of uncompressed I/Q transmission.

In the example embodiments, the RRH design does not implement any BBU functionality, i.e., it does not perform physical layer processing that is specific to any particular wireless technology. Furthermore, in the example embodiments no control signaling is exchanged between the RRHs and BBUs. This is beneficial because it limits the RRH role to a generic interfacing. This thus makes the example embodiments both technology and implementation agnostic.

While described with respect to communication between an RRH and BBU, the embodiments are not limited to this application. Instead, the example embodiments are applicable the digital signal communication between other wireless network elements. Still further, the example embodiments are applicable to digital signal communication between electronic devices. Accordingly, it will be appreciated that in some implementations, the reduction of redundancies such as in step S500 may be optional.

The example embodiments are general in nature and hence, may be applied to different wireless technologies, (e.g., LTE/LTE-Advanced and UMTS/HSPA), as well as, on the uplink and downlink. These example embodiments may be effective in any solution where a digital representation of an analog signal is to be transported. For example, one or more example embodiment could be the basis for a digital neutral host distributed antenna system (DAS).

Furthermore, the example embodiments maintain the overall signal quality, i.e., error-vector magnitude (EVM) and adjacent channel power ratio (ACPR) that are required by a particular wireless technology, i.e., standard. In addition, the example embodiments are parameterized such that a smooth trade-off between the required signal quality and compression performance can be achieved through operator choice of the suitable parameter values.

In addition, the example embodiment introduce limited processing delay (i.e., compression and decompression latency), compared to the uncompressed version.

The invention being thus described, it will be obvious that the same may be varied in many ways. Such variations are not to be regarded as a departure from the invention, and all such modifications are intended to be included within the scope of the invention.

We claim:

1. A method of compressing a digital signal, comprising:
   reducing redundancies in the digital signal;
   scaling a block of samples output from the reducing step by a scaling factor, the scaling including collecting a number of samples to form the block of samples and adaptively determining the number of samples to form the block;
   quantizing the scaled samples to produce quantized samples, the quantized samples having a resolution of a first number of bits; and
   adaptively determining the resolution used to quantize the scaled samples by,
      dequantizing the quantized samples to form dequantized samples,
      descaling the dequantized samples to form a reconstructed block of samples,
      storing the reconstructed block of samples in a memory,
      determining a variation between the reconstructed block of samples and the block of samples, and
      adjusting one or more of the resolution and the number of samples that form the block based on the variation.

2. The method of claim 1, wherein the reducing step comprises:
   filtering the digital signal; and
   decimating output from the filtering step.

3. The method of claim 1, wherein the number of samples to form the block is fixed.

4. The method of claim 1, wherein the resolution is fixed.

5. The method of claim 1, further comprising:
   determining a compression error;
   compressing the compression error; and
   sending the compressed compression error over a separate link from a link carrying the quantized samples.

6. The method of claim 1, wherein the digital signal is a complex baseband representation (I/Q) of a radio signal.

7. A method of decompressing a compressed digital signal at a decompressor, the method comprising:
   adaptively determining a resolution of received samples, the received samples having a resolution of a number of bits;
   dequantizing the received samples;
   descaling a block of the dequantized samples, the descaling including collecting a number of the dequantized samples to form the block of dequantized samples and adaptively determining the number of samples to form the block; and
   inserting redundancies into the descaled samples to produce a digital signal having a desired spectrum, wherein the decompressor adaptively determines the resolution by receiving a decompression parameter indicating the resolution from a compressor, the compressor configured to determine the resolution by,
      determining a variation between a block reconstructed samples formed by reconstructing samples previously sent to the decompressor and a latest sample to send to the decompressor, and
      adjusting one or more of the resolution and the number of samples that form the block based on the variation.

8. The method of claim 7, wherein
the dequantizing dequantizes the received samples based on the decompression parameter indicated in the received samples.

9. The method of claim 7, wherein the descaling descales the block of the dequantized samples by a factor indicated in the received samples.

10. The method of claim 7, wherein the inserting step comprises:
performing an inverse decimation process on the descaled samples; and
inverse filtering output of the performing step.

11. A network element, comprising:
circuitry generating a first digital signal;
a compressor configured to,
  reduce redundancies in the first digital signal to produce intermediate compressed samples,
  scale a block of the intermediate compressed samples by a scaling factor, the scaling including collecting a number of samples to form the block of samples and adaptively determining the number of samples to form the block,
  quantize the scaled samples to produce quantized samples, the quantized samples having a resolution of a first number of bits,
  adaptively determine the resolution used to quantize the scaled samples by,
    dequantizing the quantized samples to form tested dequantized samples,
    descaling the tested dequantized samples to form a reconstructed block of intermediate compressed samples,
    storing the reconstructed block of intermediate compressed samples in a memory,
    determining a variation between the reconstructed block of intermediate compressed samples and the block of the intermediate compressed samples, and
    adjusting one or more of the resolution and the number of samples that form the block based on the variation, and
  send the quantized samples over a transport link as a first compressed signal; and
a decompressor configured to,
  receive a second compressed signal over the transport link,
  adaptively determine a resolution of samples in the second compressed signal, the samples having a resolution of a third number of bits,
  dequantize the samples in the second compressed signal to increase the third number of bits to n bits, where n is a natural number,
  descale a block of the dequantized samples, and
  inserting redundancies into the descaled samples to produce a second digital signal having a desired spectrum.

* * * * *